United States Patent [19]

Groves et al.

[11] 4,314,167

[45] Feb. 2, 1982

[54] VOLTAGE CLAMPING CIRCUIT

[75] Inventors: Peter H. Groves, Southampton; Robert A. Hilbourne, Chandlers Ford, both of England

[73] Assignee: U.S. Philips Corporation, New York, N.Y.

[21] Appl. No.: 84,017

[22] Filed: Oct. 11, 1979

[30] Foreign Application Priority Data

Oct. 20, 1978 [GB] United Kingdom ............... 41406/78

[51] Int. Cl.³ ............................................... H03K 5/08
[52] U.S. Cl. ................................. 307/540; 307/304
[58] Field of Search ......................... 307/237, 264, 304

[56] References Cited

U.S. PATENT DOCUMENTS 3,809,926  5/1974  Young ................................. 307/237

Primary Examiner—James B. Mullins
Assistant Examiner—Gene Wan

Attorney, Agent, or Firm—Thomas A. Briody; Robert T. Mayer; Steven R. Biren

[57] ABSTRACT

A voltage clamping circuit for use in coupling line voltage signals to logic control circuitry used in domestic appliances includes a voltage dropping resistor coupled between input and output terminals. A first enhancement mode MOS transistor is coupled between a junction of the resistor and the output terminal and the $V_{DD}$ line. The gate of the first transistor is connected to the junction, so that when the voltage at the junction rises to a threshold voltage above $V_{DD}$ the first transistor is rendered conductive and clamps the positive line voltage cycle. A second enhancement mode MOS transistor is connected between the junction and the $V_{DD}$ line and its gate is connected to a biasing means which holds the second transistor nonconductive in response to the line voltage going negative until the junction is just above the $V_{SS}$ level, whereafter the second transistor turns on and clamps the input above $V_{SS}$.

4 Claims, 1 Drawing Figure

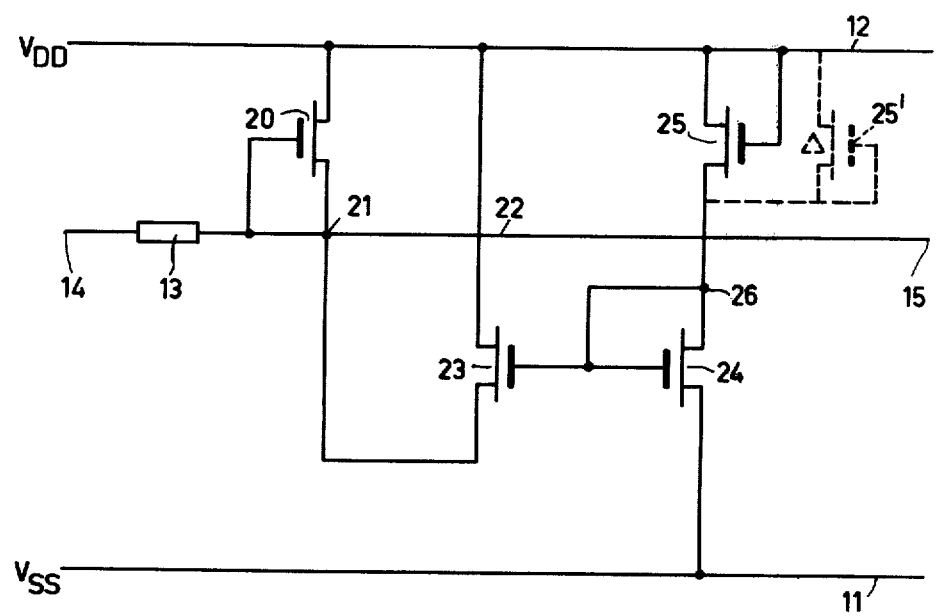

VOLTAGE CLAMPING CIRCUIT

BACKGROUND OF THE INVENTION

The present invention relates to an MOS transistor voltage clamping circuit, and particularly but not exclusively to n-channel MOS transistor voltage clamping circuits for use with MOS logic circuitry employed in domestic appliances such as washing machines and tumble driers.

In manufacturing domestic appliances it is desired to keep the control circuit and switches as simple and as inexpensive as possible consistent with reliable operation. The development of n-channel MOS transistors and integrated circuits has enabled low cost logic circuitry to be developed. In the case of switches, a problem arises in keeping the contacts clean without the need for periodic attention by a servicing engineer, accordingly line voltage is applied to the switch contacts and thereby enables the contacts to be self cleaning. The use of line voltage does present a problem to the circuit designer of how to couple line voltage to the input stage(s) of a logic circuit, since this voltage may have spikes of up to 1 kV superimposed thereon. If the logic circuit is fabricated as an integrated circuit another problem to be overcome is the effect of process variations on the parameters of the circuit elements.

SUMMARY OF THE INVENTION

According to the present invention there is provided a voltage clamping circuit comprising first and second supply voltage lines, an input for connection to an alternating voltage source to be clamped, an output, a resistive device coupled between the input and output, a first enhancement mode MOS transistor having its drain connected to a junction of the resistive impedance and the output, its source connected to the second supply line and its gate coupled to said junction, the first transistor being rendered conductive when the voltage at the junction rises to a threshold voltage above that of the second supply line, a second enhancement MOS transistor having its source connected to said junction and its drain connected to the second supply line, and biasing means coupled to the first and second supply lines for biasing the gate of the second transistor such that the second transistor is rendered conductive as the potential at said junction approaches that applied to the first supply line.

The MOS transistors may be either all n-type or all p-type enhancement mode transistors. A clamping circuit in accordance with the invention will be provided at each input of a logic circuit to which a signal at line voltage level is applied.

In an embodiment of the invention made of discrete components, the biasing means may comprise a potential divider formed by precision resistors connected in series if the second transistor is one which has a well defined threshold voltage, or by an MOS transistor connected in series with resistor. However if the clamping circuit(s) together with the logic circuit are fabricated as an integrated circuit, then the biasing means is formed by two enhancement mode MOS-transistors connected in series with the drain of one transistor connected to the source of the other transistor, the junction of these two electrodes being connected to the gate of the second transistor. Alternatively, a depletion mode transistor may replace one of these two enhancement mode transistors. An advantage of using MOS transistors as the biasing means is that the gate of the second transistor can be held slightly above the threshold voltage irrespective of process variations in the manufacture of the integrated circuit. Hence under worst case process parameters the input line voltage signal can be clamped above the substrate voltage thereby avoiding the source-substrate junction becoming forward biased which may adversely affect the operation of the logic circuitry embodied in the same integrated circuit.

BRIEF DESCRIPTION OF THE DRAWING

The present invention will now be described, by way of example, with reference to the single FIGURE of the accompanying drawing, which FIGURE is a schematic circuit diagram of one embodiment of a voltage clamping circuit for use with a line voltage of 240 V, which circuit is fabricated as an integrated circuit.

DETAILED DESCRIPTION

The voltage clamping circuit comprises a $V_{SS}$ supply line 11 and a $V_{DD}$ supply line 12. An externally mounted current limiting resistor 13 which in the illustrated embodiment has a value of 680 kΩ is connected between an input 14 and an output 15. In operation the input 14 will be connected to a source of alternating line voltage. The output 15 is connected to the input of an MOS logic circuit (not shown) for use in programming or controlling a domestic appliance such as a washing machine or tumble dryer.

A n-channel-enhancement mode MOS transistor 20 having a W/L ratio (width to length ratio) 250/7 has its drain connected to a junction 21 on a conductor 22 joining the resistor 13 to the output 15, its source connected to the line 12 and its gate connected to the conductor 22. The junction 21 is also connected to the source of another n-channel enhancement mode MOS transistor 23 having a W/L ratio of 500/7. The drain of the transistor 23 is connected to the rail 12 while its gate is connected to a biasing circuit in the form of two series connected n-channel enhancement mode MOS transistors 24 and 25 connected with their source drain paths in series between the line 11, 12. The transistor 24 has a W/L ratio of 70/6 while that of the transistor 25 is 8/28. As shown, the gate of the transistor 23 is connected to the drain/source junction 26 of the transistors 24, 25.

In operation the line voltage, in this case 240 V, 50 Hz, is applied to the input 14 and via the resistor 13 to the junction 21, the line 11 is at a voltage $V_{SS}$ of between 0 and −12 volts and the line 12 is at a voltage $V_{DD}$ which is 12 V ±10% above $V_{SS}$. As the line voltage goes positive, the voltage at the junction 21 will rise with the line voltage until it gets to the threshold voltage of the transistor 20 above $V_{DD}$ whereby the transistor 20 is turned on. The line voltage continues to rise so that the transistor 20 becomes fully conductive and clamps the voltage at the junction 21 at a level 3 to 6 volts above $V_{DD}$. The transistor 20 is rendered nonconductive by the voltage at the junction 21 minus the voltage $V_{DD}$ going below the threshold voltage of transistor 20.

In the case of the line voltage going negative, the voltage at the junction 21 follows the line voltage down towards $V_{SS}$ until the voltage at the junction 21 is just above $V_{SS}$. At that point the transistor 23 is turned on and becomes conductive to clamp the junction 21 above $V_{SS}$.

In the case of worst case process parameters, a 1 kV spike on top of the line voltage applied to the input 14 will give a voltage of 18.5 V above $V_{SS}$. Correspondingly, the presence of a negative 1 kV spike on top of the full negative line voltage may cause the junction 21 to go below $V_{SS}$ sufficiently far (greater than $\frac{1}{2}$ volt) that the source-substrate junction of the transistor 23 will be forward biased.

In designing the biasing circuit and determining the W/L ratios of the transistors 24 and 25, the following factors have to be taken into consideration. The clamping voltage level of the transistor 23 should be as close to $V_{SS}$ as possible to ensure that the signal at the output 15 is adequate to operate the first stage of the logic circuit (not shown). In the case of worst case process parameters, the junction 21 should not go so far below $V_{SS}$ to forward bias the source-substrate junction of the transistor 23, since such forward biasing may upset the remainder of the logic circuitry. Variations in device parameters, such as the threshold voltage, to process variations producing different W/L ratios within defined limits of a norm should be allowed for.

The illustrated arrangement of transistor 24 ensures that the junction 26 is always slightly above, typically 1 V, the threshold voltage of the transistor 23. The W/L ratios of the transistors 24 and 25 are chosen to give the desired voltage at the junction 26. In operation, the transistor 24 is always conductive because if its gate-source voltage decreases, the source-drain impedance of the transistor 24 rises, thereby lifting the voltage at the junction 26 and restoring the gate-source voltage.

In the illustrated embodiment the value of 680 k for the resistor 13 has been chosen to limit the current to substantially 2 mA even with 1 kV spikes on the line voltage. Obviously the precise value of the resistor 13 is chosen with regard to the line voltage and the W/L ratios of the transistors 20, 23, 24 and 25.

Although the illustrated circuit is fabricated using n-channel enhancement mode MOS transistors, it could also be fabricated using p-channel enhancement mode MOS transistors, in which case the line 11 may be at 0 volts, the rail 12 may be at $-12$ V, the transistor 20 would clamp on the negative half cycle and the transistor 23 would clamp on the positive half cycle.

In another embodiment of the invention, the enhancement mode transistor 25 may be replaced by a depletion transistor 25' with its gate connected to its source as shown in broken lines. However it is preferred that the transistors 24 and 25 to both be enhancement mode transistors, whereas if transistor 25 is a depletion mode transistor, the voltage at the junction 26 will be subject to two variables, namely the threshold voltage of an enhancement mode transistor and the threshold voltage of a depletion mode transistor.

If the clamping circuit in accordance with the invention is made from discrete components as opposed to being fabricated as an integrated circuit, various changes may be made to the biasing circuit. One such change would be to replace the transistors 24 and 25 with precision resistors and the transistor 23 with a MOS transistor with a well-defined threshold voltage.

We claim:

1. A voltage clamping circuit comprising first and second supply voltage lines, an input terminal for connection to an alternating line voltage source to be clamped, an output terminal, a resistive device coupled between the input and output terminals, a first enhancement mode MOS transistor having its drain connected to the junction of the resistive device and the output terminal, its source connected to the second supply line and its gate coupled to said junction, the first transistor being rendered conductive when the voltage at the junction rises to a threshold voltage above that of the second supply line, a second enhancement mode MOS transistor having its source connected to said junction and its drain connected to the second supply line, and biasing means coupled to the first and second supply lines for biasing the gate of the second transistor such that the second transistor is rendered conductive as the potential at said junction approaches that applied to the first supply line.

2. A circuit as claimed in claim 1, wherein the biasing means comprises two further enhancement mode MOS transistors having their source-drain paths connected in series, a second junction formed by the drain of one of the transistors and the source of the other of the transistors being connected to the gates of the second transistor and said one of the further transistors, so that said one of the further transistors holds the gate of the second transistor above a threshold voltage.

3. A circuit as claimed in claim 2, wherein all of the MOS transistors are n-channel MOS transistors.

4. A circuit as claimed in claim 1, wherein the biasing means comprises a third enhancement mode MOS transistor and a depletion mode MOS transistor having their source-drain paths connected in series, a further junction formed by the drain of the third transistor and the source of the depletion mode transistor being connected to the gates of the depletion mode, second and third transistors, so that said third transistor holds the gate of the second transistor above a treshold voltage.

* * * * *